(12) United States Patent
Fujimaki

(10) Patent No.: US 12,580,564 B2
(45) Date of Patent: Mar. 17, 2026

(54) REVERSE CONDUCTION LOSS REDUCTION CIRCUIT, SEMICONDUCTOR DEVICE, AND SWITCHING POWER SUPPLY

(71) Applicant: ROHM CO., LTD., Kyoto (JP)

(72) Inventor: Takumi Fujimaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 245 days.

(21) Appl. No.: 18/466,185

(22) Filed: Sep. 13, 2023

(65) Prior Publication Data

US 2024/0097675 A1 Mar. 21, 2024

(30) Foreign Application Priority Data

Sep. 21, 2022 (JP) ................................. 2022-150059

(51) Int. Cl.
| | |
|---|---|
| *H03K 17/567* | (2006.01) |
| *H02M 1/08* | (2006.01) |
| *H02M 3/00* | (2006.01) |
| *H02M 3/335* | (2006.01) |
| *H03K 17/0412* | (2006.01) |

(52) U.S. Cl.
CPC ............ *H03K 17/567* (2013.01); *H02M 1/08* (2013.01); *H02M 3/01* (2021.05); *H02M 3/33569* (2013.01); *H03K 17/04123* (2013.01)

(58) Field of Classification Search
CPC ........... H03K 17/567; H03K 2017/066; H03K 17/063; H03K 17/04123; H02M 3/33569; H02M 1/0006; H02M 1/08; H02M 1/0064; H02M 3/01; H02M 3/33571; H02M 3/028
See application file for complete search history.

(56) References Cited

U.S. PATENT DOCUMENTS

| | | | | |
|---|---|---|---|---|
| 10,103,633 | B1 * | 10/2018 | Knoedgen | H02M 7/487 |
| 2016/0254750 | A1 * | 9/2016 | Grezaud | H02M 1/08 |
| | | | | 323/271 |
| 2019/0273487 | A1 * | 9/2019 | Knoedgen | H03K 17/145 |
| 2024/0007020 | A1 * | 1/2024 | Bailly | H02M 7/53873 |

FOREIGN PATENT DOCUMENTS

JP 2022-067768 5/2022

\* cited by examiner

*Primary Examiner* — Thienvu V Tran
*Assistant Examiner* — Jonathan Walter Soileau
(74) *Attorney, Agent, or Firm* — Fish & Richardson P.C.

(57) ABSTRACT

A reverse conduction loss reduction circuit operates, when an enhancement-mode switching element having reverse conduction characteristics corresponding to a gate-source voltage is reverse-conducting, to raise the gate-source voltage of the switching element to a predetermined bias voltage.

6 Claims, 8 Drawing Sheets

REVERSE CONDUCTION LOSS REDUCTION CIRCUIT, SEMICONDUCTOR DEVICE, AND SWITCHING POWER SUPPLY

CROSS-REFERENCE TO RELATED APPLICATIONS

This application is based on the following Japanese Patent Application, the contents of which are hereby incorporated by reference:

(1) Japanese Patent Application published as No. 2022-150059, filed on Sep. 21, 2022

BACKGROUND OF THE INVENTION

1. Technical Field

The present disclosure relates to a reverse conduction loss reduction circuit, a semiconductor device, and a switching power supply.

2. Description of Related Art

Today, as compact switching elements capable of being driven at high frequencies, GaN devices and the like are being put into practical use.

One example of known technology related to what has just been mentioned is seen in Patent Document 1 (Japanese Unexamined Patent Application Publication No. 2022-067768).

DETAILED DESCRIPTION OF PREFERRED EMBODIMENTS

Switching Power Supply (Comparative Example)

Figure 1:
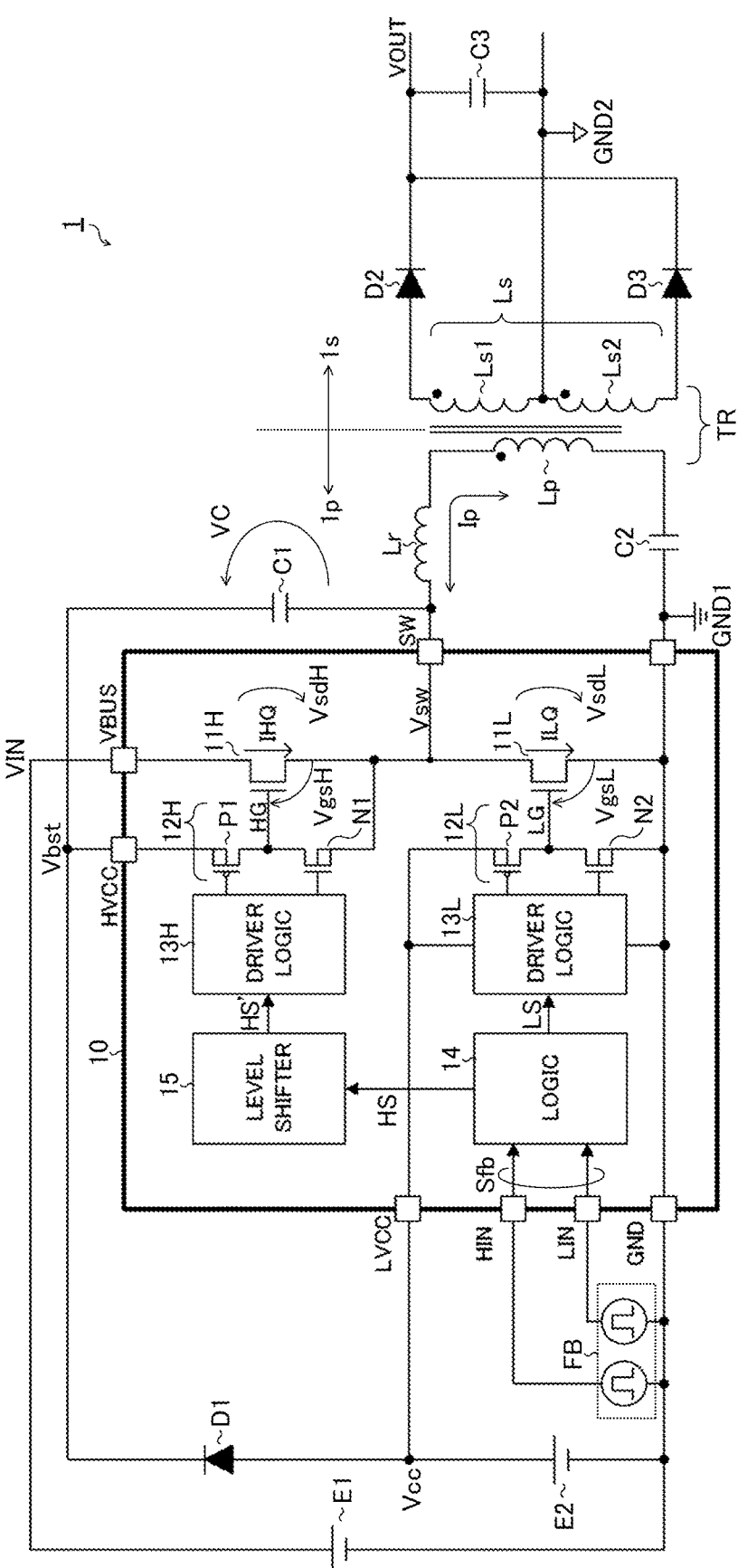
FIG. 1 is a diagram showing a comparative example of a switching power supply.

FIG. 1 is a diagram showing a comparative example (that is, a common configuration to be compared with the embodiments described later) of a switching power supply. The switching power supply 1 of this comparative example is an isolated DC-DC converter of an LLC resonance type that, while electrically isolating between a primary circuit system 1p (GND1 system) and a secondary circuit system 1s (GND2 system), generates a desired direct-current output voltage VOUT from a direct-current input voltage VIN.

To describe based on the diagram, the switching power supply 1 includes a semiconductor device 10, voltage sources E1 and E2, an output feedback circuit FB, and various discrete components (a transformer TR, capacitors C1 to C3, diodes D1 to D3, and an inductor Lr).

When the switching power supply 1 is used as an AC-DC converter, a pre-stage circuit (such as a diode bridge, a power factor correction circuit, or the like) may be separately arranged which rectifies and smooths an alternating-current input voltage VAC to generate the direct-current input voltage VIN.

The semiconductor device 10 is the controlling agent (what is called a power control IC) of the switching power supply 1. As a means for establishing electrical connection with outside the device, the semiconductor device 10 has a plurality of external terminals (in the diagram, an HVCC pin, a VBUS pin, an LVCC pin, an HIN pin, an LIN pin, a GND pin, and an SW pin).

The transformer TR includes a primary winding Lp, which is provided in the primary circuit system 1p, and a secondary winding Ls, which is provided in the secondary circuit system 1s and which is magnetically coupled with the primary winding Lp.

The first terminal (in the diagram, the winding start) of the primary winding Lp is connected to the first terminal of the inductor Lr. The second terminal of the inductor Lr is connected to the SW pin of the semiconductor device 10 (that is, an application terminal for a switching voltage Vsw). The second terminal (in the diagram, the winding end) of the primary winding Lp is connected to the first terminal of the capacitor C2. The second terminal of the capacitor C2 is connected to the GND pin of the semiconductor device 10 and to the grounded terminal of the primary circuit system 1p (that is, an application terminal for a ground voltage GND1).

The transformer TR may be a leakage transformer or a resonance transformer. That is, the inductor Lr may be a leakage inductance of the transformer TR.

The first terminal (for example, the winding start) of a secondary winding Ls1 is connected to the anode of a diode D2. The first terminal (for example, the winding end) of a secondary winding Ls2 is connected to the anode of a diode D3. The cathodes of the diodes D2 and D3 and the first terminal of the capacitor C3 are all connected to an application terminal for the direct-current output voltage VOUT. The second terminal (for example, the winding end) of the secondary winding Ls1 and the second terminal (for example, the winding start) of the secondary winding Ls2 as well as the second terminal of the capacitor C3 are all connected to the ground terminal of the secondary circuit system 1s (that is, an application terminal for the ground voltage GND2). The secondary windings Ls1 and Ls2 can be understood as a single secondary winding Ls with a center tap.

Thus connected, the transformer TR, the inductor Lr, the diodes D2 and D3, and the capacitors C2 and C3 together with a high-side switching element 11H and a low-side switching element 11L (of which details will be given later) incorporated in the semiconductor device 10 form a switching output stage of an LLC resonance type that generates a desired direct-current output voltage VOUT from the direct-current input voltage VIN. In particular, the diodes D2 and D3 and the capacitor C3 function as a rectifying and smoothing circuit that rectifies and smooths an induced voltage appearing in the secondary winding Ls to generate the direct-current output voltage VOUT.

The positive terminal of the voltage source E1 (that is, an application terminal for the direct-current input voltage VIN) is connected to the VBUS pin of the semiconductor device 10. The positive terminal of the voltage source E2

(that is, an application terminal for a supply voltage Vcc) and the anode of the diode D1 are both connected to the LVCC pin of the semiconductor device 10. The negative terminals of the voltage sources E1 and E2 are both connected to the GND pin of the semiconductor device 10 (that is, the application terminal for the ground voltage GND1). The cathode of the diode D1 and the first terminal of the capacitor C1 are both connected to the HVCC pin of the semiconductor device 10 (that is, an application terminal for a boosted voltage Vbst). The second terminal of the capacitor C1 is connected to the SW pin of the semiconductor device 10 (that is, the application terminal for the switching voltage Vsw).

Thus connected, the diode D1 and the capacitor C1 function as a bootstrap circuit that generates a boosted voltage Vbst that is always higher than the switching voltage Vsw by the terminal-to-terminal voltage VC ($\approx$Vcc–Vf, where Vf is the forward drop voltage of the diode D1) across the capacitor C1. That is, when Vsw$\approx$0 V (GND1), Vbst$\approx$VC and, when Vsw$\approx$VIN, Vbst$\approx$Vin+VC.

The output feedback circuit FB generates a feedback signal Sfb commensurate with the direct-current output voltage VOUT to feed the feedback signal Sfb to the HIN and LIN pins of the semiconductor device 10. The output feedback circuit FB can be configured in any way. For example, the output feedback circuit FB is generally configured to use a shunt regulator and a photocoupler, or configured to use an auxiliary winding of the transformer TR.

<Semiconductor Device>

With reference still to FIG. 1, the configuration and operation of the semiconductor device 10 will be described. The semiconductor device 10 of this comparative example includes a high-side switching element 11H, a low-side switching element 11L, a high-side driver 12H, a low-side driver 12L, a high-side driving logic circuit 13H, a low-side driving logic circuit 13L, a logic circuit 14, and a level shifter 15.

The drain of the high-side switching element 11H (for example, of an n-channel type) is connected to the VBUS pin. The source of the high-side switching element 11H is connected to the SW pin. The gate of the high-side switching element 11H is connected to an application terminal for a high-side gate signal HG. Thus connected, the high-side switching element 11H is on when the high-side gate signal HG is at high level ($\approx$Vbst) and is off when the high-side gate signal HG is at low level ($\approx$Vsw).

The drain of the low-side switching element 11L (for example, of an n-channel type) is connected to the SW pin. The source of the low-side switching element 11L is connected to the GND pin. The gate of the low-side switching element 11L is connected to an application terminal for a low-side gate signal LG. Thus connected, the low-side switching element 11L is on when the low-side gate signal LG is at high level ($\approx$Vcc), and is off when the low-side gate signal LG is at low level ($\approx$GND1).

In this way, the semiconductor device 10 includes, as switching elements, the high-side and low-side switching elements 11H and 11L that are connected in series between the application terminal for the direct-current input voltage VIN (corresponding to a first voltage) and the application terminal for the ground voltage GND1 (corresponding to a second voltage).

The high-side and low-side switching elements 11H and 11L may be enhancement-mode (that is, normally-off) switching elements having reverse conduction characteristics corresponding to a high-side gate-source voltage VgsH (=HG–Vsw) and a low-side gate-source voltage VgsL (=LG–GND1) respectively. For example, the high-side and low-side switching elements 11H and 11L may be GaN devices. Here, a GaN device may be a device comprising a combination of a GaN-HEMT (high-electron-mobility transistor) and a MOSFET (metal-oxide-semiconductor field-effect transistor).

The high-side and low-side switching elements 11H and 11L may be incorporated in the semiconductor device 10 as integrated elements, or may be externally connected to the semiconductor device as discrete elements.

The high-side driver 12H generates the high-side gate signal HG. In terms of what is shown in FIG. 1, the high-side driver 12H includes a transistor P1 (for example, a p-channel MOSFET) and a transistor N1 (for example, an n-channel MOSFET). The source of the transistor P1 is connected to the HVCC pin. The drains of the transistors P1 and N1 are both connected to an application terminal for the high-side gate signal HG (the gate of the high-side switching element 11H). The source of the transistor N1 is connected to the SW pin.

Thus, the high-side gate signal HG is at high level ($\approx$Vbst) when the transistor P1 is on and the transistor N1 is off. In contrast, the high-side gate signal HG is at low level ($\approx$Vsw) when the transistor P1 is off and the transistor N1 is on.

The low-side driver 12L generates the low-side gate signal LG. In terms of what is shown in FIG. 1, the low-side driver 12L includes a transistor P2 (for example, a p-channel MOSFET) and a transistor N2 (for example, an n-channel MOSFET). The source of the transistor P2 is connected to the LVCC pin. The drains of the transistors P2 and N2 are both connected to an application terminal for the low-side gate signal LG (that is, the gate of the low-side switching element 11L). The source of the transistor N2 is connected to the GND1 pin.

Thus, the low-side gate signal LG is at high level ($\approx$Vcc) when the transistor P2 is on and the transistor N2 is off. In contrast, the low-side gate signal LG is at low level ($\approx$GND1) when the transistor P2 is off and the transistor N2 is on.

The high-side driving logic circuit 13H controls the driving of the high-side driver 12H in accordance with a level-shifted high-side control signal HS'. For example, the high-side driving logic circuit 13H keeps the transistor P1 on and the transistor N1 off when the level-shifted high-side control signal HS' is at high level. In contrast, the high-side driving logic circuit 13H keeps the transistor P1 off and the transistor N1 on when the level-shifted high-side control signal HS' is at low level.

The low-side driving logic circuit 13L controls the driving of the low-side driver 12L in accordance with a low-side control signal LS. For example, the low-side driving logic circuit 13L keeps the transistor P2 on and the transistor N2 off when the low-side control signal LS is at high level. In contrast, the low-side driving logic circuit 13L keeps the transistor P2 off and the transistor N2 on when the low-side control signal LS is at low level.

The logic circuit 14 generates the high-side and low-side control signals HS and LS so as to turn on an off the high-side and low-side switching elements 11H and 11L complementarily in accordance with the feedback signal Sfb fed to the HIN pin and the LIN pin.

In the present description, the term "complementarily" can be understood broadly to cover not only operation in which the on/off states of the high-side and low-side switching elements 11H and 11L are reversed completely but also operation in which a delay is secured in the timing of on/off transition of the high-side and low-side switching elements 11H and 11L (operation in which what is called a simultaneously-off period (dead time) is left).

The logic circuit 14 can perform output feedback control employing any well-known technology (such as a voltage mode control method, a current mode control method, or a hysteresis control method).

The level shifter 15 shifts the signal level of the high-side control signal HS to generate the level-shifted high-side control signal HS'.

Figure 2:
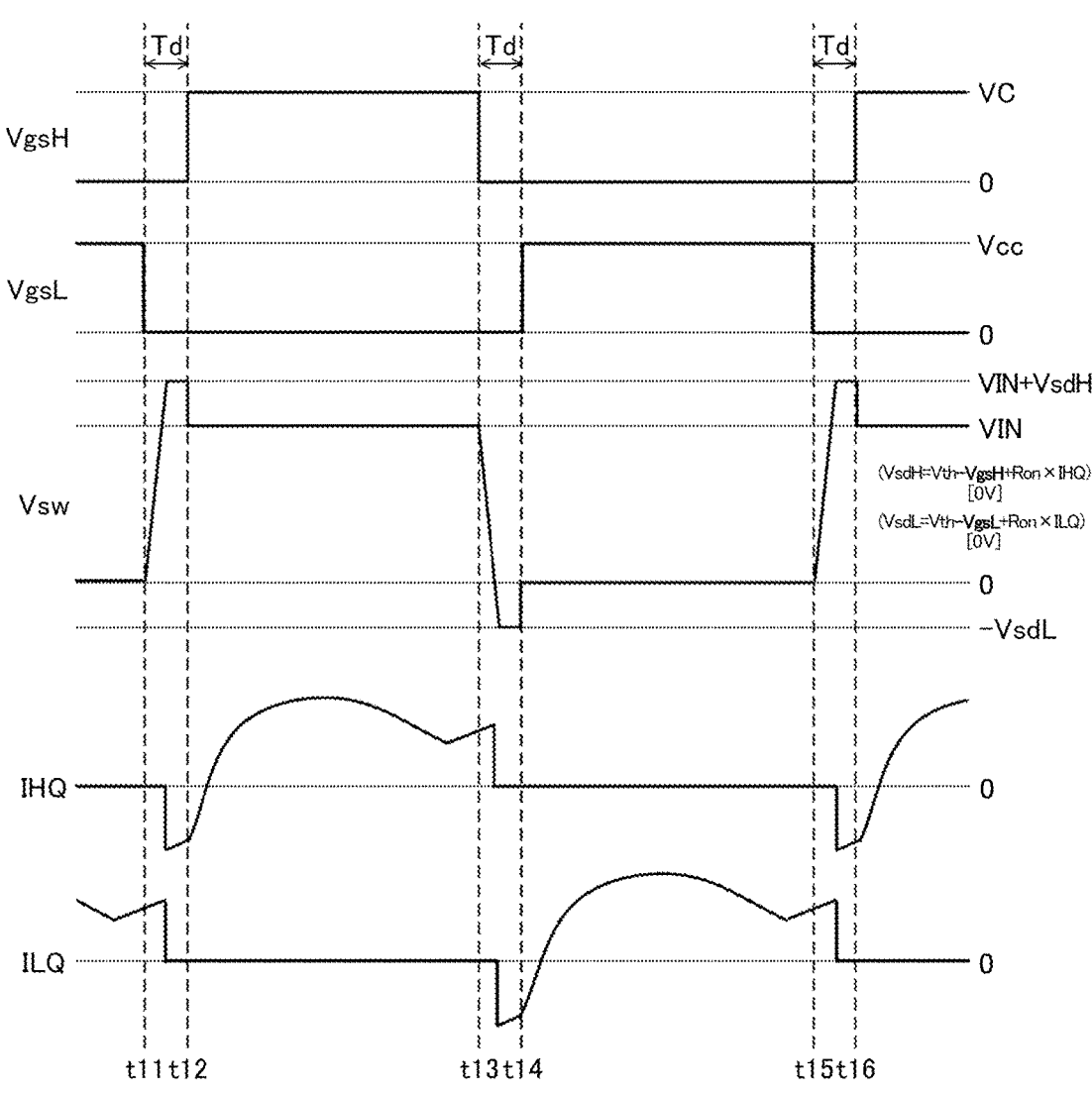
FIG. 2 is a diagram showing operation waveforms in the comparative example.

FIG. 2 is a diagram showing operation waveforms in this comparative example. FIG. 2 depicts, from top down, the high-side gate-source voltage VgsH, the low-side gate-source voltage VgsL, the switching voltage Vsw, a high-side switch current IHQ that passes in the high-side switching element 11H, and a low-side switch current ILQ that passes in the low-side switching element 11L.

For the high-side switch current IHQ, the direction from the VBUS pin to the SW pin is defined as positive (+), and the opposite direction is defined as negative (−). For the low-side switch current ILQ, the direction from the SW pin to the GND1 pin is defined as positive (+), and the opposite direction is defined as negative (−).

Between time points t12 to t13, the high-side gate-source voltage VgsH is at high level VC) and the low-side gate-source voltage VgsL is at low level (≈0). Accordingly, the high-side switching element 11H is on and the low-side switching element 11L is off. Thus, the positive high-side switch current IHQ increases and the switching voltage Vsw remains at high level (≈VIN). Meanwhile, the low-side switch current ILQ does not pass.

At time point t13, while the high-side switch current IHQ passes, the high-side gate-source voltage VgsH falls to low level (≈0) and the high-side switching element 11H is turned off. At this time, the primary winding Lp and the inductor Lr tend to maintain a primary current Ip passing through them.

However, since the current path via the high-side switching element 11H is cut off, no positive high-side switch current IHQ passes. Thus, the primary current Ip passes as a reverse conduction current (that is, the negative low-side switch current ILQ) via the low-side switching element 11L. Here, the switching voltage Vsw drops down to a negative voltage (=−VsdL) lower than the ground voltage GND1 (=0V) by the low-side source-drain voltage VsdL.

Between time points t14 to t15, the high-side switching element 11H is off and the low-side switching element 11L is on. Thus, the positive low-side switch current ILQ increases and the switching voltage Vsw turns to low level (≈GND1). Here, no high-side switch current IHQ passes.

At time point t15, while the low-side switch current ILQ passes, the low-side gate-source voltage VgsL falls to low level (≈0), and the low-side switching element 11L is turned off. At this point, the primary winding Lp and the inductor Lr tend to hold a primary current Ip passing through them.

However, since the current path via the low-side switching element 11L is cut off, no positive low-side switch current ILQ passes. Thus, the primary current Ip passes as a reverse conduction current (that is, the negative high-side switch current IHQ) via the high-side switching element 11H. Here, the switching voltage Vsw increases to a positive voltage (=VIN+VsdH) higher than the direct-current input voltage VIN by the high-side source-drain voltage VsdH.

<Discussion on Reverse Conduction Loss>

Incidentally, in a dead time period Td in which the high-side and low-side switching elements 11H and 11L are both off, a reverse conduction loss Ploss (=Vsd×IQ×Td×

Fsw×2, where Vsd=VsdH=VsdL, IQ=IHQ=ILQ, and Fsw is the switching frequency) arises.

Here, when the high-side and low-side switching elements 11H and 11L are both MOSFETs, Vsd=Vf (where Vf is the forward drop voltage of a body diode that accompanies the MOSFET). Generally, Vsd is about 0.7 V to 1 V.

In contrast, when the high-side and low-side switching elements 11H and 11L are both GaN devices, Vsd=Vth−Vgs+Ron×IQ (where Vth and Ron are the on-threshold voltage and the on-resistance of the GaN device). Generally, Vsd is about 3 to 4 V (at Vgs=0 V).

Figure 3:
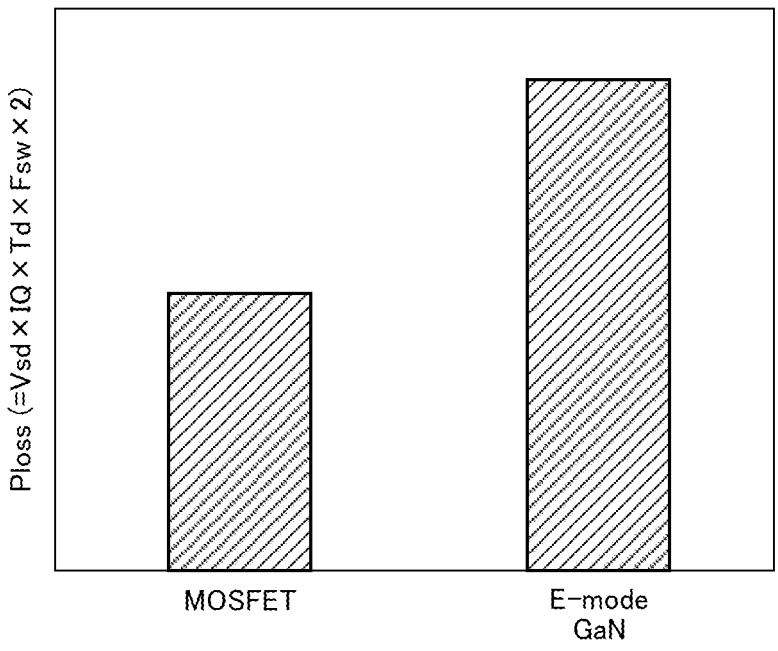
FIG. 3 is a diagram showing reverse conduction loss in the comparative example.

FIG. 3 is a diagram showing the reverse conduction loss Ploss in the comparative example. As shown in the diagram, when enhancement-mode GaN devices are used as the high-side and low-side switching elements 11H and 11L (at right in FIG. 3), compared with a case where MOSFETs are used (at left in FIG. 3), the reverse conduction loss Ploss increases.

For example, suppose Vf=1V, Vth=1, 4V, Vgs=0 V, Ron=70 mΩ, IQ=5 A, Fsw=300 kHz, and Td=100 ns, then the reverse conduction loss Ploss when the MOSFET is used is 0.30 W, and that when the GaN device is used is 0.53 W.

As discussed above, while, as compared with the MOSFET, the GaN device is more compact and allows high-frequency driving, it suffers an increased reverse conduction loss Ploss in the dead time period Td. The reverse conduction loss Ploss in the dead time period Td increases in proportion to the switching frequency Fsw. Thus, in an application in which high-frequency driving of the GaN device is required, it is important to reduce the reverse conduction loss Ploss in the dead time period Td.

Switching Power Supply (First Embodiment)

Figure 4:
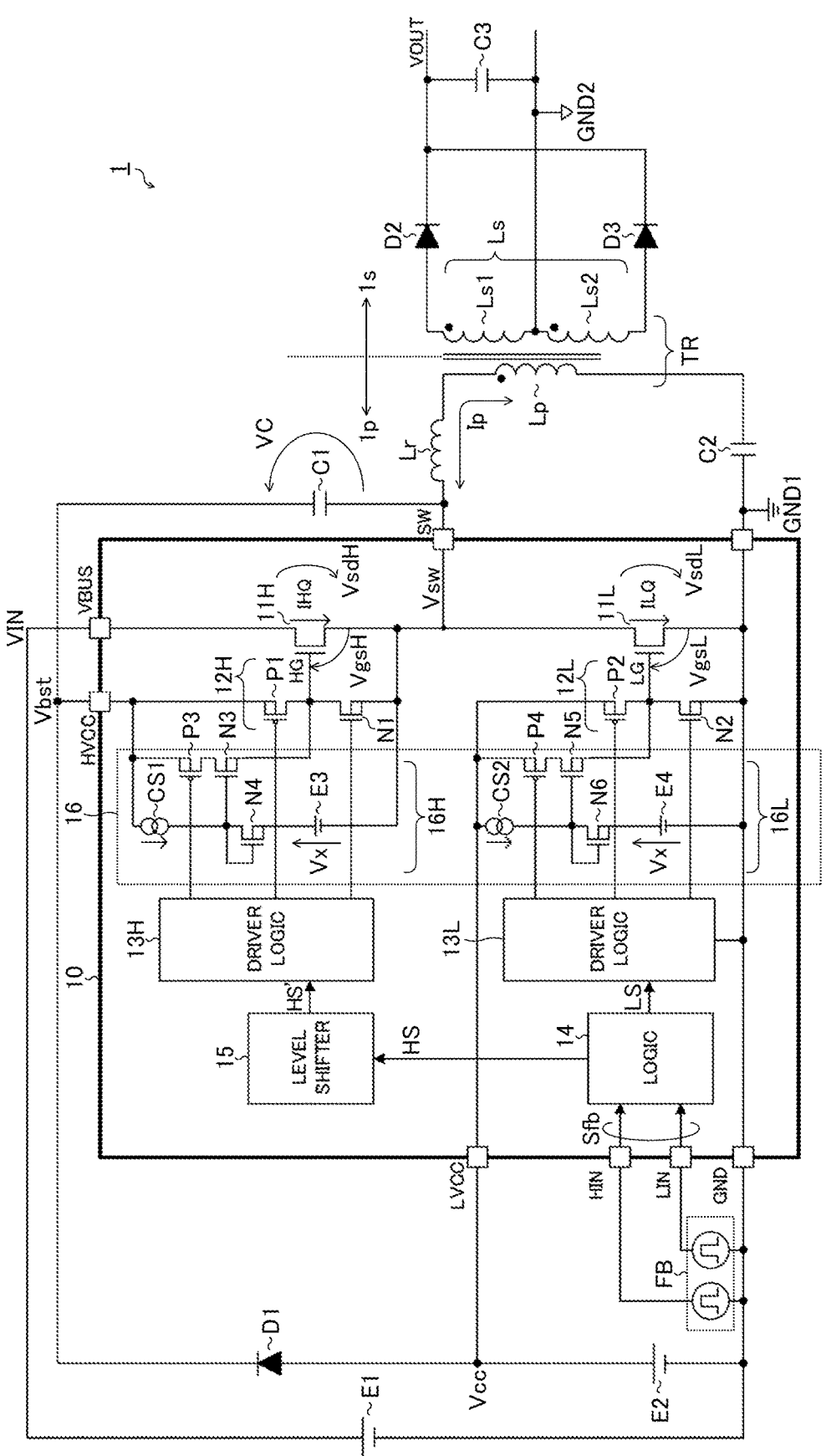
FIG. 4 is a diagram showing a switching power supply according to a first embodiment.

FIG. 4 is a diagram showing a switching power supply 1 according to a first embodiment. The switching power supply 1 of this embodiment is based on the comparative example discussed previously (FIG. 1), but has a modified internal configuration in the semiconductor device 10. In terms of what is shown in FIG. 4, the semiconductor device 10 further includes, in addition to the circuit elements already described, a reverse conduction loss reduction circuit 16.

The following description assumes that the high-side and low-side switching elements 11H and 11L are each an enhancement-mode GaN device with reverse conduction characteristics corresponding to the high-side gate-source voltage VgsH and the low-side gate-source voltage VgsL.

The reverse conduction loss reduction circuit 16 has a function of raising the high-side and low-side gate-source voltages VgsH and VgsL to a predetermined bias voltage Vx when the high-side and low-side switching elements 11H and 11L are reverse-conducting.

In terms of what is shown in FIG. 4, the reverse conduction loss reduction circuit 16 includes a high-side pre-on driver 16H and a low-side pre-on driver 16L.

The high-side pre-on driver 16H, when the high-side switching element 11H is reverse-conducting, operates to raise the high-side gate-source voltage VgsH of the high-side switching element 11H from 0 V to the bias voltage Vx.

For example, the high-side pre-on driver 16H may, during the on-period of the low-side switching element 11L, operate to raise the high-side gate-source voltage VgsH of the high-side switching element 11H from 0 V to the bias voltage Vx.

In terms of what is shown in FIG. 4, the high-side pre-on driver 16H includes a transistor P3 (for example, a p-channel MOSFET), transistors N3 and N4 (for example, n-channel MOSFETs), a voltage source E3, and a current source CS1.

The source of the transistor P3 and the first terminal of the current source CS1 are both connected to the HVCC pin. The drain of the transistor P3 is connected to the drain of the transistor N3. The source of the transistor N3 is connected to the application terminal for the high-side gate signal HG (that is, the gate of the high-side switching element 11H). The gate of the transistor P3 is connected to the output terminal of the high-side driving logic circuit 13H.

The gate of the transistor N3 and the second terminal of the current source CS1 are both connected to the drain of the transistor N4. The gate of the transistor N4 is connected to the drain of the transistor N4. The source of the transistor N4 is connected to the positive terminal of the voltage source E3. The negative terminal of the voltage source E3 is connected to the SW pin. The voltage source E3 generates the bias voltage Vx at its positive terminal relative to the switching voltage Vsw fed to its negative terminal.

For example, when the transistors P1 and P3 are both off and the transistor N1 is on, the switching voltage Vsw is applied as the high-side gate signal HG. Thus, the high-side gate-source voltage VgsH (=HG−Vsw) is 0 V.

In contrast, when the transistors P1 and N1 are both off and the transistor P3 is on, a voltage higher than the switching voltage Vsw by the bias voltage Vx (=Vsw+Vx) is applied as the high-side gate signal HG. Thus, the bias voltage Vx is applied as the high-side gate-source voltage VgsH (=HG−Vsw).

The low-side pre-on driver 16L, when the low-side switching element 11L is reverse-conducting, operates to raise the low-side gate-source voltage VgsL of the low-side switching element 11L from 0 V to the bias voltage Vx.

For example, the low-side pre-on driver 16L may, during the on-period of the high-side switching element 11H, operate to raise the low-side gate-source voltage VgsL of the low-side switching element 11L from 0 V to the bias voltage Vx.

In terms of what is shown in FIG. 4, the low-side pre-on driver 16L includes a transistor P4 (for example, a p-channel MOSFET), transistors N5 and N6 (for example, n-channel MOSFETs), a voltage source E4, and a current source CS2.

The source of the transistor P4 and the first terminal of the current source CS2 are both connected to the LVCC pin. The drain of the transistor P4 is connected to the drain of the transistor N5. The source of the transistor N5 is connected to the application terminal for the low-side gate signal LG (that is, the gate of the low-side switching element 11L). The gate of the transistor P4 is connected to the output terminal of the low-side driving logic circuit 13L.

The gate of the transistor N5 and the second terminal of the current source CS2 are both connected to the drain of the transistor N6. The gate of the transistor N6 is connected to the drain of the transistor N6. The source of the transistor N6 is connected to the positive terminal of the voltage source E4. The negative terminal of the voltage source E4 is connected to the GND pin. The voltage source E4 generates the bias voltage Vx at its positive terminal relative to the ground voltage GND1 fed to its negative terminal.

For example, when the transistors P2 and P4 are both off and the transistor N2 is on, the ground voltage GND1 is applied as the low-side gate signal LG. Thus, the low-side gate-source voltage VgsL (=LG−GND1) is 0 V.

In contrast, when the transistors P2 and N2 are both off and the transistor P4 is on, a voltage (=GND1+Vx) higher than the ground voltage GND1 by the bias voltage Vx is applied as the low-side gate signal LG. Thus, the bias voltage Vx is applied as the low-side gate-source voltage VgsL (=LG−GND1).

Figure 5:
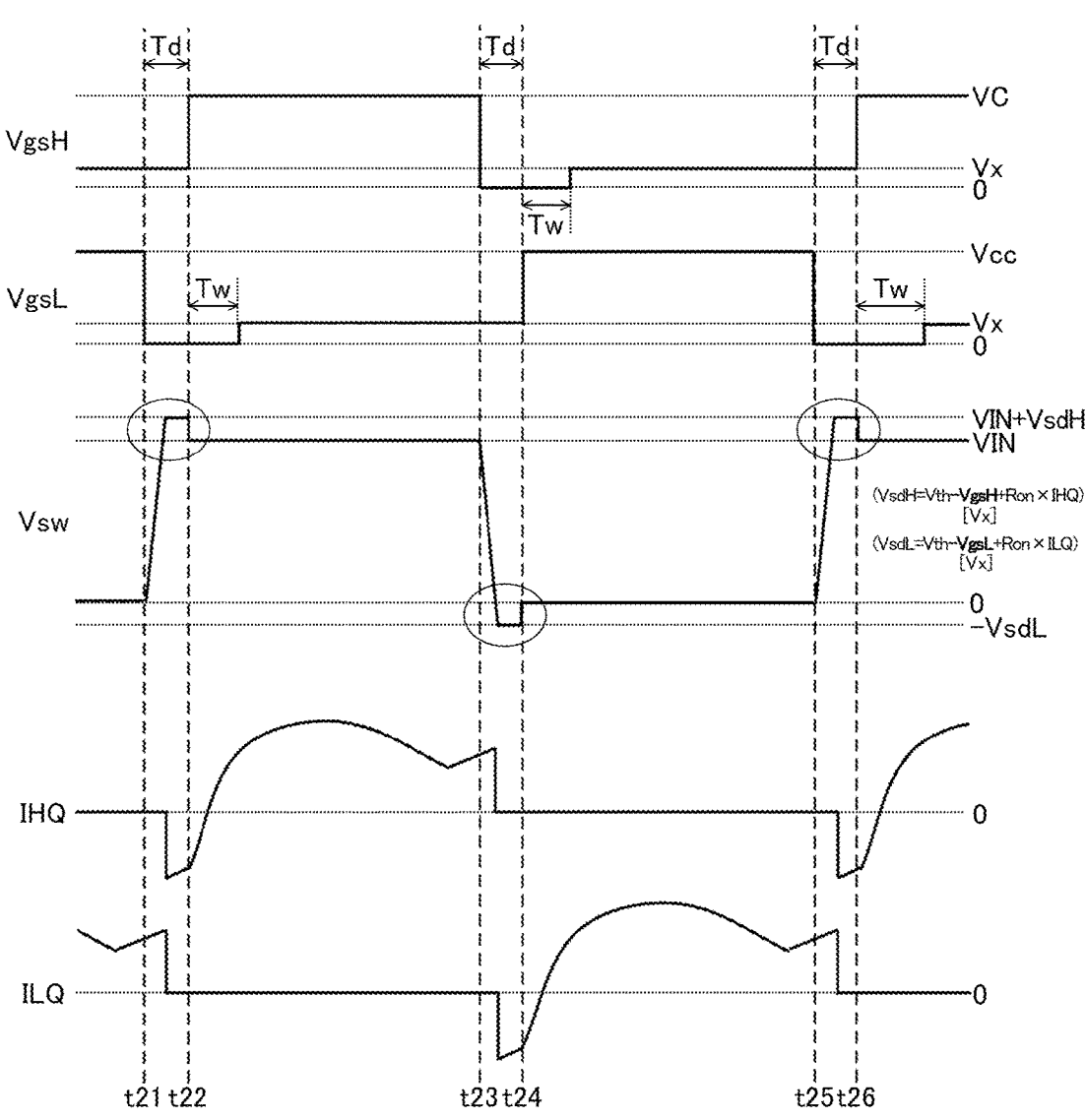
FIG. 5 is a diagram showing operation waveforms in the first embodiment.

FIG. 5 is a diagram showing operation waveforms in the first embodiment. FIG. 5 depicts, like FIG. 2 referred to previously, from top down, the high-side gate-source voltage VgsH, the low-side gate-source voltage VgsL, the switching voltage Vsw, the high-side switch current IHQ, and the low-side switch current ILQ.

The operation waveforms in the first embodiment shown in FIG. 5 are basically similar to the operation waveforms (FIG. 2) in the comparative example. That is, with time points t11 to t16 in FIG. 2 read as t21 to t26 in FIG. 5, the relevant previous description gives an understanding of the basic operation of the switching power supply 1 here.

A difference is that, in the switching power supply 1 of this embodiment, the reverse conduction loss reduction circuit 16 described previously performs biasing control on the high-side and low-side gate-source voltages VgsH and VgsL.

In terms of what is shown in FIG. 5, when the low-side switching element 11L is reverse-conducting (for example, between time points t23 and t24), the low-side gate-source voltage VgsL is raised to the bias voltage Vx. For example, the low-side gate-source voltage VgsL may be raised from 0 V to the bias voltage Vx at the time point when the wait time Tw has elapsed after the high-side gate-source voltage VgsH is raised to high level. Through such biasing control, the low-side source-drain voltage VsdL (=Vth−VgsL+Ron× ILQ) becomes lower by the bias voltage Vx than that when no bias is applied (VgsL=0 V). Thus, it is possible to reduce reverse conduction loss in the low-side switching element 11L.

For another example, when the high-side switching element 11H is reverse-conducting (for example, between time points t21 and t22 and between time points t25 and t26), the high-side gate-source voltage VgsH is raised to the bias voltage Vx. For example, the high-side gate-source voltage VgsH may be raised from 0 V to the bias voltage Vx at the time point when the wait time Tw has elapsed after the low-side gate-source voltage VgsL is raised to high level. Through such biasing control, the high-side source-drain voltage VsdH (=Vth−VgsH+Ron×IHQ) becomes lower by the bias voltage Vx than that when no bias is applied (VgsH=0 V). Thus, it is possible to reduce reverse conduction loss in the high-side switching element 11H.

The bias voltage Vx may be set to a voltage value (for example, Vx=0.8 V) higher than 0 V but lower than the on-threshold voltages Vth of the high-side and low-side switching elements 11H and 11L. With such voltage setting, it is possible to prevent the high-side and low-side switching elements 11H and 11L being on simultaneously.

Figure 6:
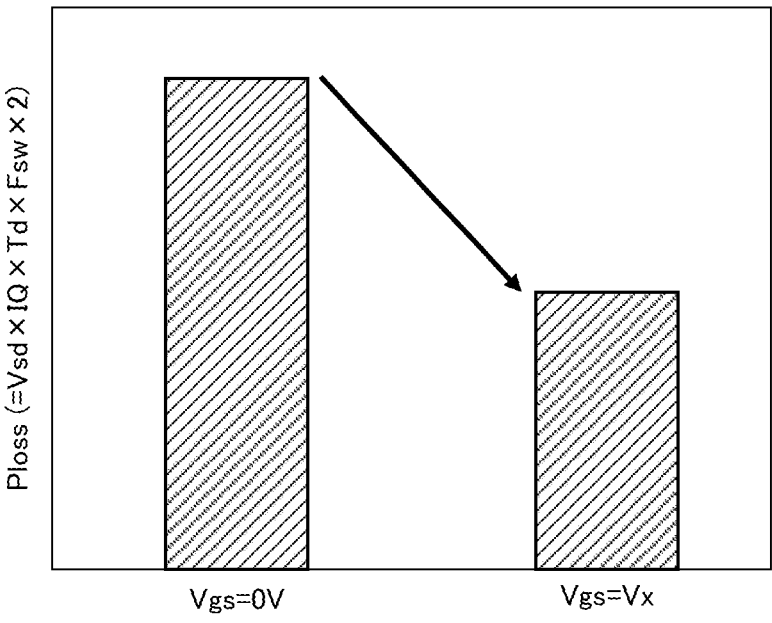
FIG. 6 is a diagram showing reverse conduction loss in the first embodiment.

FIG. 6 is a diagram showing the reverse conduction loss in the first embodiment. As shown in the diagram, when the bias voltage Vx is applied as the gate-source voltage Vgs (at right in FIG. 6), compared with when no bias voltage Vx is applied (at left in FIG. 6), the reverse conduction loss Ploss is lower.

For example, suppose Vth=1.4 V, Vx=0.8 V, Ron=70 mΩ, IQ=5 A, Fsw=300 kHz, and Td=100 ns, then the reverse conduction loss Ploss with no bias applied is 0.53 W, and the reverse conduction loss Ploss with a bias applied is 0.32 W.

Switching Power Supply (Second Embodiment)

Figure 7:
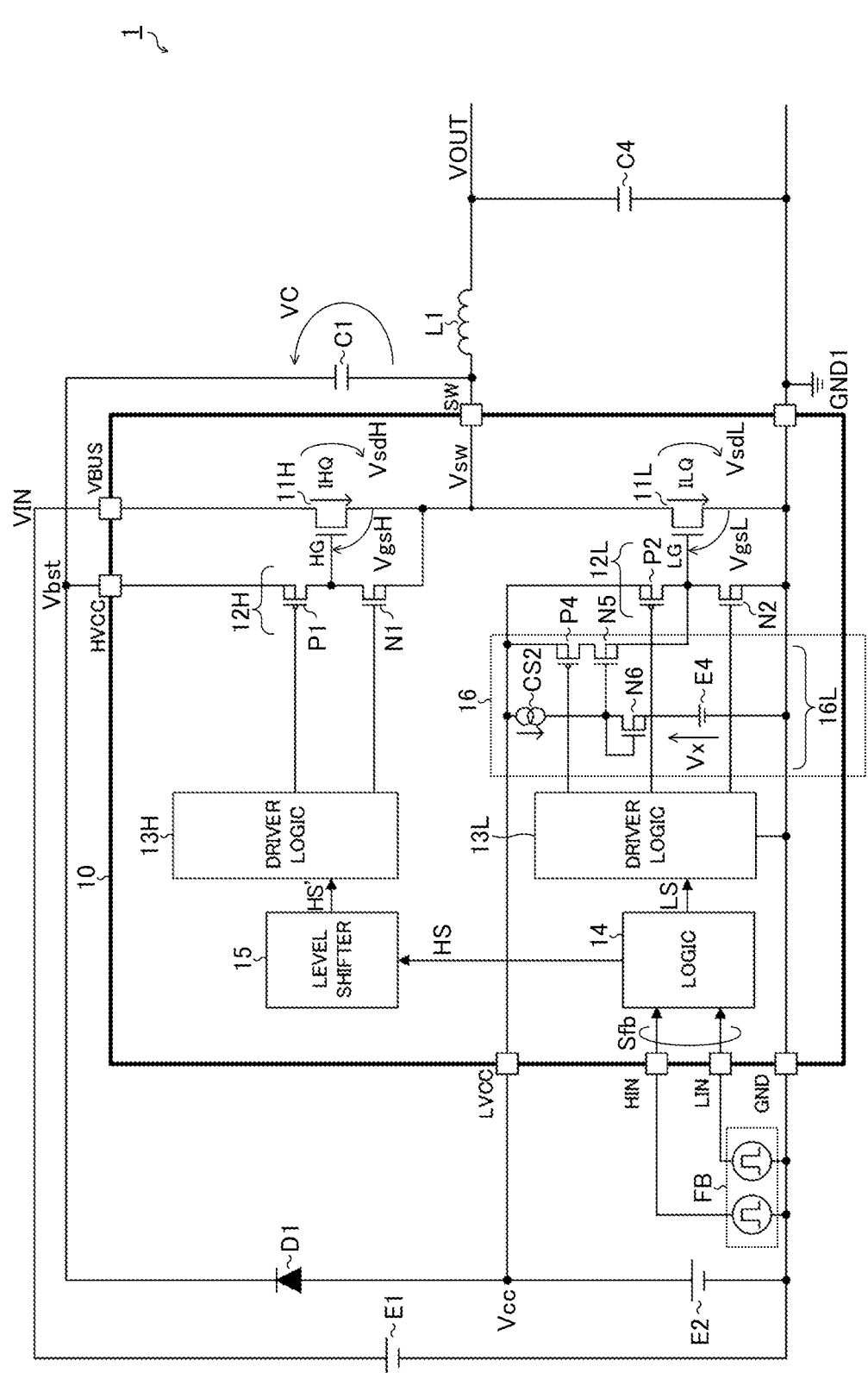
FIG. 7 is a diagram showing a switching power supply according to a second embodiment.

FIG. 7 is a diagram showing a switching power supply 1 according to a second embodiment. The switching power supply 1 of this embodiment is based on the first embodiment (FIG. 4) discussed previously, but has a modified topology in the switching output stage that generates the direct-current output voltage VOUT from the direct-current input voltage VIN.

In terms of what is shown in FIG. 7, in the switching power supply 1 of this embodiment, instead of the transformer TR, the inductor Lr, the capacitors C2 and C3, and the diodes D2 and D3 described previously, an inductor L1 and a capacitor C4 are externally connected to the semiconductor device 10.

The first terminal of the inductor L1 is connected to the SW pin of the semiconductor device 10. The second terminal of the inductor L1 and the first terminal of the capacitor C4 are both connected to the application terminal for the direct-current output voltage VOUT. The second terminal of the capacitor C4 is connected to the GND pin of the semiconductor device 10 (that is, the application terminal for the ground voltage GND1).

Thus connected, the inductor L1 and the capacitor C4, together with the high-side and low-side switching elements 11H and 11L incorporated in the semiconductor device 10, form a switching output stage of a buck type that generates from the direct-current input voltage VIN the direct-current output voltage VOUT.

To accommodate the topological modification described above, also the internal configuration of the semiconductor device 10 is modified. In terms of what is shown in FIG. 7, the high-side pre-on driver 16H described previously is removed.

Figure 8:
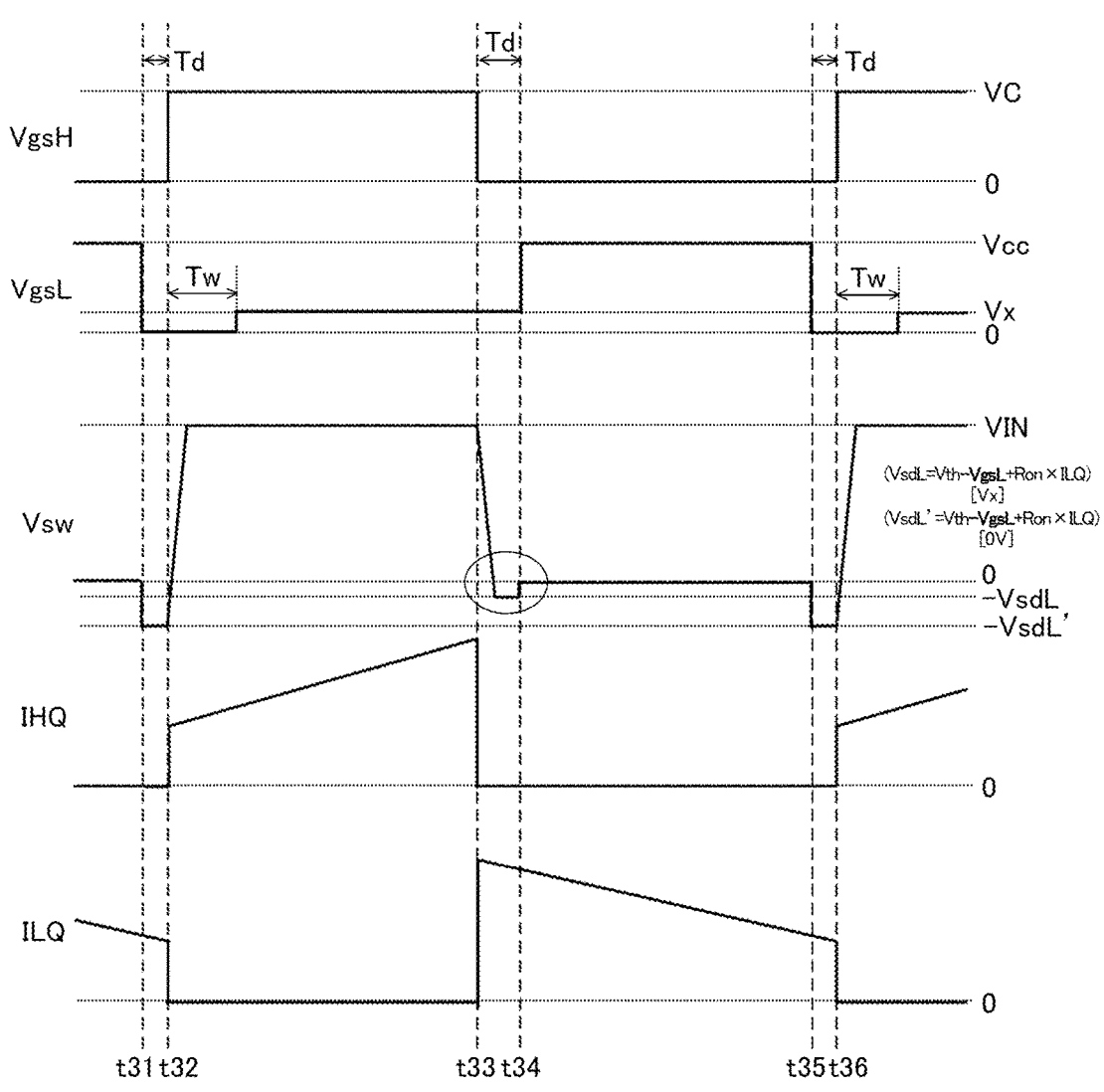
FIG. 8 is a diagram showing operation waveforms in the second embodiment.

FIG. 8 is a diagram showing operation waveforms in the second embodiment. FIG. 8 depicts, like FIGS. 2 and 5 referred to previously, from top down, the high-side gate-source voltage VgsH, the low-side gate-source voltage VgsL, the switching voltage Vsw, the high-side switch current IHQ, and the low-side switch current ILQ.

In the switching power supply 1 of this embodiment, the reverse conduction loss reduction circuit 16 described previously performs biasing control on the low-side gate-source voltage VgsL.

In terms of what is shown in FIG. 8, when the low-side switching element 11L is reverse-conducting (for example, between time points t33 and t34), the low-side gate-source voltage VgsL is raised to the bias voltage Vx. For example, the low-side gate-source voltage VgsL may be raised from 0 V to the bias voltage Vx at the time point when the wait time Tw has elapsed after the high-side gate-source voltage VgsH is raised to high level. Through such biasing control, the low-side source-drain voltage VsdL ($=$Vth$-$VgsL+Ron$\times$ILQ) becomes lower by the bias voltage Vx than the low-side source-drain voltage VsdL' when no bias is fed (VgsL$=$0 V). Thus, it is possible to reduce reverse conduction loss in the low-side switching element 11L.

In this way, the reverse conduction loss reduction circuit 16 can be applied not only to an LLC resonant converter that is controlled by soft switching but also to a synchronous rectification block in a buck converter that is controlled by hard switching.

Overview

To follow is an overview of the various embodiments described herein.

According to one aspect of what is disclosed herein, a reverse conduction loss reduction circuit is configured to, when an enhancement-mode switching element having reverse conduction characteristics corresponding to a gate-source voltage is reverse-conducting, raise the gate-source voltage of the switching element to a predetermined bias voltage. (A first configuration.)

In the reverse conduction loss reduction circuit according to the first configuration described above, preferably, the bias voltage is higher than 0 V but lower than the on-threshold voltage of the switching element. (A second configuration.)

According to another aspect of what is disclosed herein, a semiconductor device includes the reverse conduction loss reduction according to the first or second configuration described above. (A third configuration.)

The semiconductor device according to the third configuration described above, preferably, further includes, as the switching element, a high-side switching element and a low-side switching element that are connected in series between an application terminal for a first voltage and an application terminal for a second voltage. (A fourth configuration.)

In the semiconductor device according to the fourth configuration described above, preferably, the reverse conduction loss reduction circuit includes a low-side pre-on driver configured to, when the low-side switching element is reverse-conducting, raise the gate-source voltage of the low-side switching element to the bias voltage. (A fifth configuration.)

In the semiconductor device according to the fifth configuration described above, preferably, the low-side pre-on driver is configured to, during the on-period of the high-side switching element, raise the gate-source voltage of the low-side switching element to the bias voltage. (A sixth configuration.)

In the semiconductor device according to any of the fifth to sixth configurations described above, preferably, the reverse conduction loss reduction circuit further includes a high-side pre-on driver configured to, when the high-side switching element is reverse-conducting, raise the gate-source voltage of the high-side switching element to the bias voltage. (A seventh configuration.)

In the semiconductor device according to the seventh configuration described above, preferably, the high-side pre-on driver is configured to, during the on-period of the low-side switching element, raise the gate-source voltage of the high-side switching element to the bias voltage. (An eighth configuration.)

In the semiconductor device according to any of the third to eighth configurations described above, preferably, the switching element is a GaN device. (A ninth configuration.)

According to yet another aspect of what is disclosed herein, a switching power supply includes the semiconductor device according to any of the third to ninth configurations described above and an output stage that is externally connected to the semiconductor device and that is configured to generate a desired output voltage from an input voltage. (A tenth configuration.)

With the present disclosure, it is possible to reduce reverse conduction loss that arises in switching elements such as GaN devices.

Further Modifications

The various technical features disclosed herein may be implemented in any other manners than in the embodiments described above, and allow for any modifications made without departure from their technical ingenuity. That is, the embodiments described above should be considered to be illustrative in all respects and should not be considered to be restrictive. It should be understood that the technical scope of the present invention is defined by the scope of claims and encompasses any modifications made in a scope and sense equivalent to the scope of claims.

What is claimed is:

1. A semiconductor device comprising a reverse conduction loss reduction circuit, wherein the reverse conduction loss reduction circuit is configured to, when an enhancement-mode switching element having reverse conduction characteristics corresponding to a gate-source voltage is reverse-conducting, raise the gate-source voltage of the enhancement-mode switching element to a predetermined bias voltage, the semiconductor device comprises, as the enhancement-mode switching element, a high-side switching element and a low-side switching element that are connected in series between an application terminal for a first voltage and an application terminal for a second voltage, wherein the reverse conduction loss reduction circuit includes a low-side pre-on driver configured to, when the low-side switching element is reverse-conducting, raise the gate-source voltage of the low-side switching element to the predetermined bias voltage, and the low-side pre-on driver is configured to, during an on-period of the high-side switching element, raise the gate-source voltage of the low-side switching element to the predetermined bias voltage.

2. The semiconductor device according to claim 1, wherein the predetermined bias voltage is higher than 0 V but lower than an on-threshold voltage of the enhancement-mode switching element.

3. A semiconductor device comprising a reverse conduction loss reduction circuit, wherein the reverse conduction loss reduction circuit is configured to, when an enhancement-mode switching element having reverse conduction characteristics corresponding to a gate-source voltage is reverse-conducting, raise the gate-source voltage of the enhancement-mode switching element to a predetermined bias voltage, the semiconductor device comprises, as the enhancement-mode switching element, a high-side switching element and a low-side switching element that are connected in series between an application terminal for a first voltage and an application terminal for a second voltage, the reverse conduction loss reduction circuit includes a low-side pre-on driver configured to, when the low-side switching element is reverse-conducting, raise the gate-source voltage of the low-side switching element to the predetermined bias voltage, and the reverse conduction loss reduction circuit further includes a high-side pre-on driver configured to, when the high-side switching element is reverse-conducting, raise the gate-source voltage of the high-side switching element to the predetermined bias voltage.

4. The semiconductor device according to claim 3, wherein the high-side pre-on driver is configured to, during an on-period of the low-side switching element, raise the gate-source voltage of the high-side switching element to the predetermined bias voltage.

5. The semiconductor device according to claim 1, wherein the enhancement-mode switching element is a GaN device.

6. A switching power supply comprising:

the semiconductor device according to claim 1; and an output stage externally connected to the semiconductor device, the output stage being configured to generate a desired output voltage from an input voltage.

* * * * *